(12) United States Patent
Akerib (10) Patent No.: US 10,817,370 B2
(45) Date of Patent: Oct. 27, 2020

(54) SELF CORRECTING MEMORY DEVICE

(71) Applicant: GSI Technology Inc., Sunnyvale, CA (US)

(72) Inventor: Avidan Akerib, Tel Aviv (IL)

(73) Assignee: GSI Technology Inc., Sunnyvale, CA (US)

( * ) Notice: Subject to any disclaimer, the term of this patent is extended or adjusted under 35 U.S.C. 154(b) by 3 days.

(21) Appl. No.: 16/221,635

(22) Filed: Dec. 17, 2018

(65) Prior Publication Data

US 2020/0192753 A1  Jun. 18, 2020

(51) Int. Cl.
*G06F 11/10* (2006.01)
*H03K 19/20* (2006.01)
*G11C 11/418* (2006.01)
*G11C 11/419* (2006.01)

(52) U.S. Cl.
CPC ...... *G06F 11/1056* (2013.01); *G06F 11/1016* (2013.01); *H03K 19/20* (2013.01); *G11C 11/418* (2013.01); *G11C 11/419* (2013.01)

(58) Field of Classification Search
CPC . G06F 11/1056; G06F 11/1016; H03K 19/20; G11C 11/418; G11C 11/419
See application file for complete search history.

(56) References Cited

U.S. PATENT DOCUMENTS

| | | | |
|---|---|---|---|
| 5,592,618 A * | 1/1997 | Micka | G06F 11/2074 711/162 |
| 6,822,890 B2 * | 11/2004 | Torjussen | G06F 11/08 365/145 |
| 7,143,249 B2 * | 11/2006 | Strange | G06F 11/2082 711/162 |
| 9,558,812 B2 | 1/2017 | Akerib | |
| 9,672,107 B1 * | 6/2017 | Horn | G06F 11/1076 |
| 2007/0198602 A1 * | 8/2007 | Ngo | G06F 16/217 |
| 2012/0079175 A1 * | 3/2012 | Flynn | G11C 7/1012 711/103 |
| 2013/0318392 A1 * | 11/2013 | Guo | G06F 11/2094 714/6.11 |
| 2015/0006790 A1 * | 1/2015 | Avila | G11C 11/5628 711/103 |
| 2015/0100848 A1 * | 4/2015 | Kalamatianos | G11C 29/78 714/764 |
| 2017/0192860 A1 * | 7/2017 | Vijayan | G06F 3/0619 |
| 2018/0121302 A1 * | 5/2018 | Miller | G06F 3/0644 |
| 2019/0095112 A1 * | 3/2019 | Lingarajappa | G06F 3/0656 |

* cited by examiner

*Primary Examiner* — Kyle Vallecillo
(74) *Attorney, Agent, or Firm* — Heidi Brun Associaes Ltd.

(57) ABSTRACT

A self-correcting memory device (SCMD) includes a non-destructive memory array that includes memory cells arranged in rows and columns that includes a storage section, a comparison section, a comparing element, a selective write unit and a row decoder. The storage section stores a first copy, a second copy and a third copy of a data item in physically separated columns. The comparison section temporarily stores the first copy in a first row and the second copy in a second row. The comparing element compares between bits of the first and second rows and provides at least one per bit change indication. The selective write unit receives at least one per bit change indication and fetches from the third copy a correct value for each bit having a positive bit change indication. The row decoder concurrently writes each correct value back to its bit location in the first and second copies.

14 Claims, 5 Drawing Sheets

|      | 311 | 312 | 313 |
|------|-----|-----|-----|
| BIT 1 | 1 | 1 | 1 |
| BIT 2 | 1 | 1 | 1 |
| BIT 3 | 1 | 1 | 1 |
| BIT 4 | 0 | 1 | 0 |
| BIT 5 | 0 | 0 | 0 |
| BIT 6 | 1 | 1 | 1 |
| BIT 7 | 1 | 1 | 1 |

511

530

|      | 311 | 312 | 313 |
|------|-----|-----|-----|
| BIT 1 | 1 | 1 | 1 |
| BIT 2 | 1 | 1 | 1 |
| BIT 3 | 1 | 1 | 1 |
| BIT 4 | 0 | 0 | 0 |
| BIT 5 | 0 | 0 | 0 |
| BIT 6 | 1 | 1 | 1 |
| BIT 7 | 1 | 1 | 1 |

531
532

520

|                  | BIT 1 | BIT 2 | BIT 3 | BIT 4 | BIT 5 | BIT 6 | BIT 7 |
|------------------|-------|-------|-------|-------|-------|-------|-------|
| ROW 321          | 1 | 1 | 1 | 0 | 0 | 1 | 1 |
| ROW 322          | 1 | 1 | 1 | 1 | 0 | 1 | 1 |
| BL (V1 AND V2)   | 1 | 1 | 1 | 0 | 0 | 1 | 1 |
| BL' (V1 NOR V2)  | 0 | 0 | 0 | 0 | 1 | 0 | 0 |
| CR (V1 XNOR V2)  | 0 | 0 | 0 | 1 | 0 | 0 | 0 |

FIG. 6

SELF CORRECTING MEMORY DEVICE

FIELD OF THE INVENTION

The present invention relates to memory cells generally and to error detection and correction in SRAM memory arrays in particular.

BACKGROUND OF THE INVENTION

Figure 1:
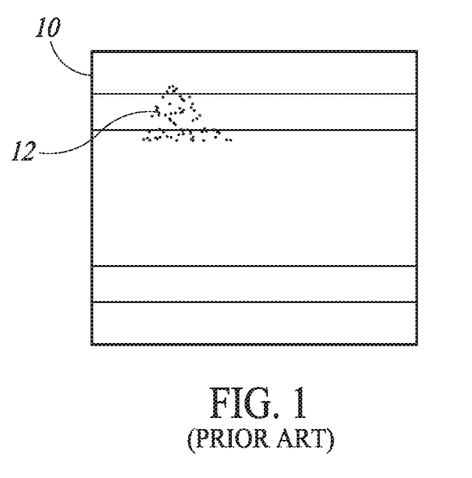
FIG. 1 is a schematic illustration of a corrupted region in a memory array.

Data is stored in memory arrays, each word in one row of the memory array. The stored data may be corrupted, i.e. an external factor, such as radiation, may cause undesirable changes to the data stored in the memory array. Bits may undesirably change their values from zero to one and vice versa. When the data is corrupted in the memory array, the corruption is usually localized. FIG. 1 illustrates a memory array 10 and a corrupted region 12 in which bits may have a wrong value.

Corrupted data may cause unpredictable and undesirable results and modern systems attempt to detect corruption and then recover or correct the corruption. A mechanism such as error-correcting code (ECC) may be used to first detect and then correct errors in the memory.

A mechanism for error detection may use one additional parity bit for each 8 bits of data. Another popular mechanism for error correction is the Hamming code which uses 6 additional bits for every 16 bits of data.

SUMMARY OF THE PRESENT INVENTION

There is provided, in accordance with a preferred embodiment of the present invention, a comparing unit that includes a non-destructive memory array, a plurality of word lines, first bit lines and second bit lines and a NOR gate. The non-destructive memory array includes memory cells arranged in rows and columns. Each word line activates memory cells in a row, thereby establishing an activated row. Each first bit line provides the result of a Boolean 'AND' operation between data stored in a first activated row and data stored in a second activated row, and each second bit line provides the result of a Boolean 'NOR' operation between data stored in the first activated row and data stored in the second activated row. Each NOR gate is connected to the per column first and second bit lines thereby comparing data stored in the first activated row with data stored in the second activated row.

Moreover, in accordance with a preferred embodiment of the present invention, each NOR gate per column provides a positive change indication when a bit in the first activated row is different from a bit in the second activated row.

There is provided, in accordance with a preferred embodiment of the present invention, a self-correcting memory device (SCMD) that includes a non-destructive memory array that includes memory cells arranged in rows and columns. The SCMD includes a storage section, a comparison section, a comparing element, a selective write unit and a row decoder. The storage section stores a first copy, a second copy and a third copy of a data item in physically separated columns in the memory array. The comparison section temporarily stores the first copy in a first row and the second copy in a second row of the memory array. The comparing element compares between bits of the first and second rows and provides at least one per bit change indication. The selective write unit receives the at least one per bit change indication and fetches from the third copy a correct value for each bit having a positive bit change indication. The row decoder concurrently writes each correct value back to its bit location in the first and second copies.

There is provided, in accordance with a preferred embodiment of the present invention, a self-correcting memory device (SCMD) that includes an SRAM memory array, a row decoder, a NOR unit and a write unit. The SRAM memory array includes memory cells arranged in rows and columns and stores a first copy of a data item in a first row, a second copy of the data item in a second row and a third copy of the data item in a third row. The row decoder concurrently activates the first row and the second row. The NOR unit compares between bits of the first row and bits of the second row and provides per bit change indications. The write unit receives the per bit change indications, fetches a correct value from the row and the row decoder concurrently writes the correct value back into the first row and the second row.

Further, in accordance with a preferred embodiment of the present invention, the address of the first row and the address of the second row differ in the LSB (least significant bit).

Still further, in accordance with a preferred embodiment of the present invention, the row decoder includes an address receiver to receive one or more destination addresses and a row activator to activate rows located in the one or more destination addresses.

Moreover, in accordance with a preferred embodiment of the present invention, the address receiver to receive a partial address and the row activator to activate a plurality of rows in addresses having a prefix identical to the partial address.

Additionally, in accordance with a preferred embodiment of the present invention, the correct value is an entire row and the row decoder to write the entire row into the first row and the second row.

Moreover, in accordance with a preferred embodiment of the present invention, the correct value includes bits indicated by a positive change indication and the row decoder to write the bits to locations in the first row and locations in the second row, the locations indicated by the positive change indications.

There is provided, in accordance with a preferred embodiment of the present invention, a method for comparing bits in a non-destructive memory array that includes memory cells arranged in rows and columns, cells in a column connected by a pair of a first and a second bit lines. The method includes storing bits to compare in a same column such that a bit from a first data item is stored in a first row and a bit from a second data item is stored in a second row. The method also includes activating the first and second rows thereby providing in each first bit line a result of a Boolean AND operation between data stored in the first activated row and data stored in the second activated row and thereby providing in each second bit line a result of a Boolean NOR operation between data stored in the first activated row and data stored in the second activated row. The method also includes connecting each pair of bit lines to a NOR gate per column thereby comparing data stored in the first activated row with data stored in the second activated row.

Moreover, in accordance with a preferred embodiment of the present invention, each NOR gate per column provides a positive change indication when a bit in the first activated row is different from a bit in the second activated row.

There is provided, in accordance with a preferred embodiment of the present invention, a method for detecting and correcting errors in a non-destructive memory array comprising memory cells arranged in rows and columns. The method includes storing a first copy, a second copy and a third copy of a data item in physically separated columns in the memory array. Temporarily storing the first copy in a first row and the second copy in a second row of the memory array, comparing between bits of the first and second rows and providing at least one per bit change indication, receiving the at least one per bit change indication and fetching from the third copy a correct value for each bit having a positive bit change indication. The method also includes writing each correct value back into a bit, indicated by the positive change indication, in the first and second copies.

There is provided, in accordance with a preferred embodiment of the present invention, a method for detecting and correcting errors in a non-destructive memory array comprising memory cells arranged in rows and columns. The method includes storing a first copy of a data item in a first row, a second copy of the data item in a second row and a third copy of the data item in a third row, concurrently activating the first row and the second row, comparing between bits of the first row and bits of the second row and providing per bit change indications, fetching a correct value from the third row and writing the correct value back into the first row and the second row.

Further, in accordance with a preferred embodiment of the present invention, the address of the first row and the address of the second row differ in the LSB.

Still further, in accordance with a preferred embodiment of the present invention, the comparing includes receiving one or more destination addresses and activating rows located in the destination addresses.

Moreover, in accordance with a preferred embodiment of the present invention, the destination address is a partial address and the activating step activates a plurality of rows in addresses having a prefix identical to the partial address.

Additionally, in accordance with a preferred embodiment of the present invention, the correct value is an entire data item and the writing step includes writing the entire data item into the first row and into the second row.

Further, in accordance with a preferred embodiment of the present invention, the correct value includes bits indicated by a positive change indication and the writing step includes writing the correct values to locations in the first row and the second row, each of the locations indicated by a positive change indication.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Applicant has realized that the memory array described in U.S. Pat. No. 9,558,812, assigned to the common assignee of the present invention and incorporated herein by reference, may be used to create a memory device capable of fixing any number of errors within any data item stored in the memory array.

U.S. Pat. No. 9,558,812 describes a system capable of accessing multiple rows in each computation cycle, resulting in the ability to perform multiple cell operations, such as a multi-cell write operation and a multi-cell computation. The cells in the system of U.S. Pat. No. 9,558,812 are arranged in a matrix where all the cells in the same column are connected to the same pair of bit lines (marked herein below in FIG. 2A as a data bit line BL and a complement bit line BL'), and all the cells in the same row are connected to the same word line (marked herein below in FIG. 2A as $WL_x$). Once a word line is activated, the content of the cells will affect the content of the bit lines.

When multiple word lines $WL_x$ are activated at the same time, the voltage levels of the bit lines connecting the cells in the multiple rows are affected by the data signals of all selected cells connected to the bit lines. In particular, in a read operation, the content of the bit lines BL and BL' connecting several selected cells reflect the result of the Boolean operations "AND" and "NOR", respectively, performed on the values stored in all selected cells.

In a write operation the bit line BL may be charged to a voltage level associated with the value to be written to the cells and bit line BL' may be charged to the complementary voltage level. In order to perform a selective write operation, i.e. write to cells located in multiple rows, multiple word lines $WL_x$ may be activated and the voltage level on a bit line BL may be written to all cells connected by bit line BL and activated by multiple word lines $WL_x$.

In accordance with an embodiment of the present invention, the value on bit lines BL and BL' connecting two activated cells may be utilized to provide an indication whether the values stored in the two activated cells are identical.

Figure 2A:
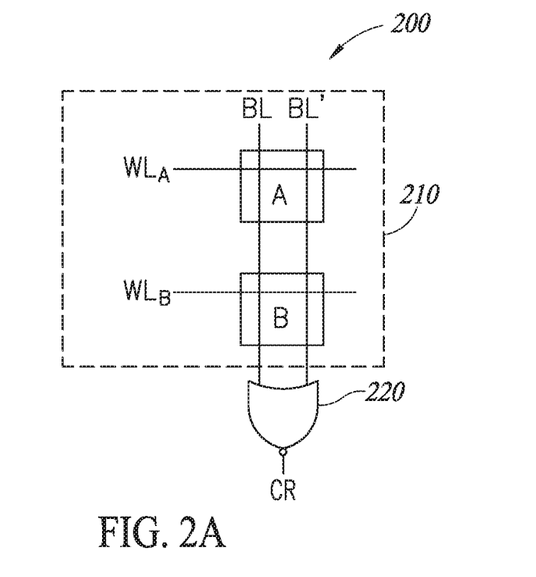
FIG. 2A is a schematic illustration of a comparing unit, constructed and operative in accordance with an embodiment of the present invention.

Reference is now made to FIG. 2A, which schematically illustrates a comparing unit 200, constructed and operative in accordance with the present invention. Comparing unit 200 comprises a column 210 of memory cells, having a structure similar to the one described in U.S. Pat. No. 9,558,812, and a NOR gate 220.

Column 210 comprises two cells A and B, two bit lines BL and BL' connecting cells A and B and two word lines $WL_A$ and $WL_B$ to activate cells A and B respectively (similarly to the structure of a column in U.S. Pat. No. 9,558,812). Bit line BL connects the data signals stored in cells A and B and therefore provides the value of the Boolean operation AND performed between A and B (A AND B). Bit line BL' connects the inverse of the data signal stored in cells A and B therefore provides the value of the Boolean operation NOR performed between A and B (A NOR B).

According to an embodiment of the present invention, NOR gate 220 may be connected to bit line BL and bit line BL' of column 210 and may provide the result of a NOR operation performed between the signal on bit line BL and the signal of bit line BL'. When both A and B are activated by word line $WL_A$ and word line $WL_B$ respectively, the output CR of NOR gate 220 can be described by Equation 1:

$$CR=(A \text{ AND } B) \text{ NOR } (A \text{ NOR } B) \qquad \text{Equation 1.}$$

Simplifying Equation 1 results in Equation 2:

$$CR=(A \text{ XNOR } B) \qquad \text{Equation 2.}$$

That is, when both cell A and cell B are activated, the output CR of NOR gate 220 may provide the value of the Boolean operation XNOR performed between A and B (A XNOR B) which is a comparison result between A and B. The value of CR is 0 (CR=0) when A equals B and is 1 (CR=1) when A doesn't equal B. Thus, CR may provide an indication regarding a possible change to a value of a bit in either A or B, where, typically, the positive change indication indicates a change. In accordance to one embodiment of the present invention, the value 1 in CR implies that one of the bits, either A or B, has been corrupted.

Figure 2B:
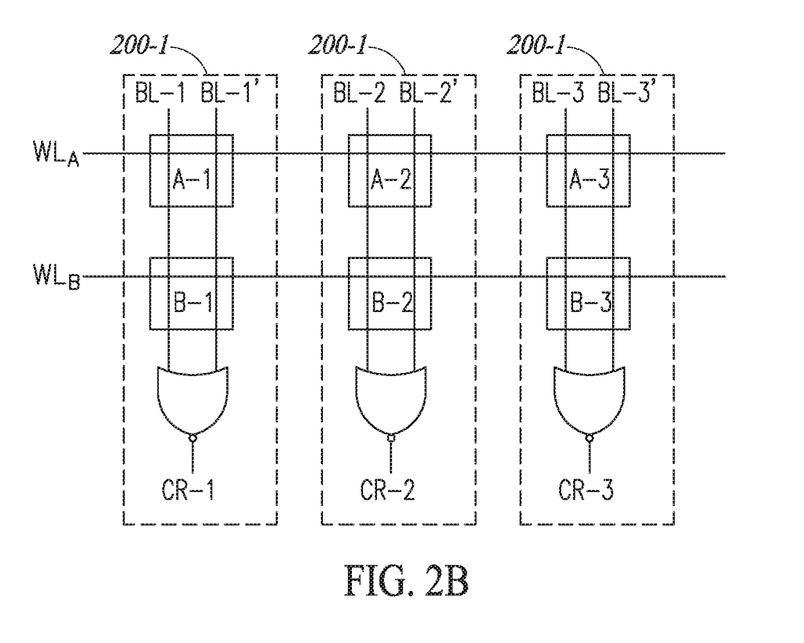
FIG. 2B is a schematic illustration of three connected comparing units of FIG. 2A.

Reference is now made to FIG. 2B, which schematically illustrates three comparing units 200-1, 200-2 and 200-3 connected by two word lines word line $WL_A$ and word line $WL_B$. When both word line $WL_A$ and word line $WL_B$ are activated, CR-1, CR-2 and CR-3 simultaneously provide an indication of whether or not the value of the data stored in each comparing unit is corrupted. CR-1 may provide an indication of whether the value of A-1 equals the value of B-1, CR-2 may provide an indication of whether the value of A-2 equals the value of B-2 and CR-3 may provide an indication of whether the value of A-3 equals the value of B-3. It may be appreciated that, if two data items A and B of n bits are connected on the two word lines $WL_A$ and $WL_B$, respectively, then n comparing units 200 may simultaneously provide a comparison result, simultaneously comparing between each pair of cells A-j and B-j.

Figure 3:
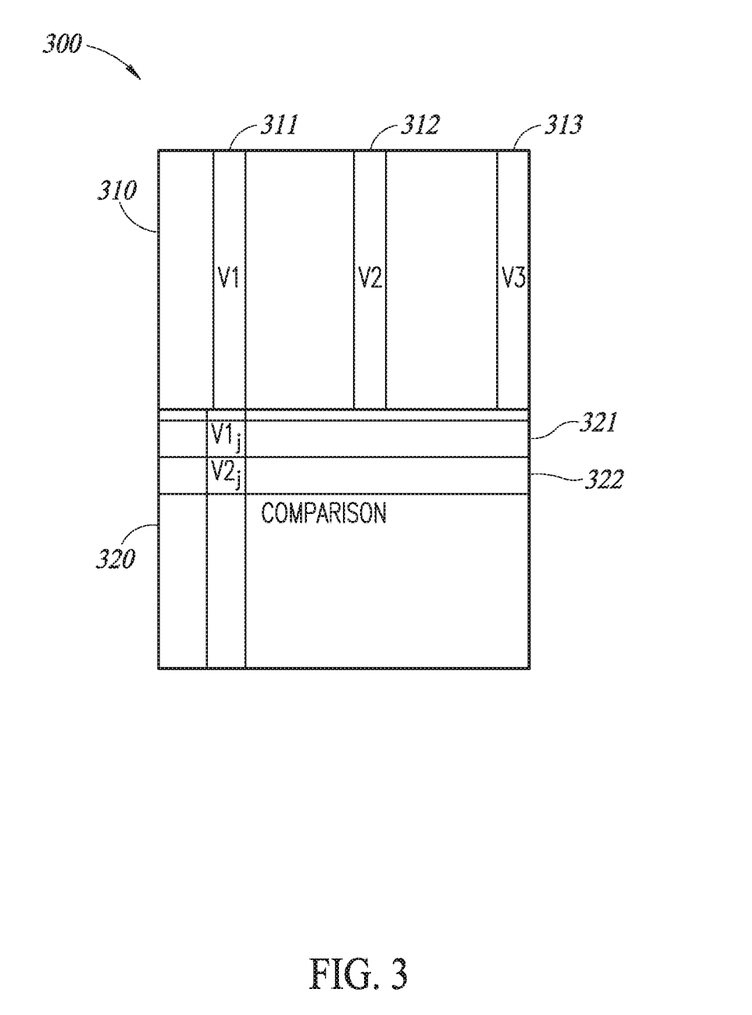
FIG. 3 is a schematic illustration of an error correction unit, constructed and operative in accordance with an embodiment of the present invention.

Reference is now made to FIG. 3, which schematically illustrates an error correction unit 300 constructed and operative in accordance with the present invention.

Error correction unit 300 comprises a storage section 310 and a comparison section 320. Storage section 310 may store data in columns, and comparison section 320 may store data in rows as detailed herein below and may concurrently compare bits stored in different rows, using comparing units 220 as described in detail with respect to FIG. 4 herein below.

Storage section 310 may comprise a plurality of cells arranged in rows and columns. Three identical copies of a data item V may be stored in three physically different columns in storage section 310. Three copies V1, V2 and V3 may be needed for the error detection and correction procedure: two copies to compare at any one time, in order to detect errors (if the copies are not identical, an error occurred) and a third copy (located remotely from the two other copies) assumed to be uncorrupted, to be used as a reliable copy of the original data item V from which the correct bit values may be read and written back into the corrupted copies.

A first copy of V, V1, may be stored in column 311. A second copy of V, V2, may be stored in column 312 distantly located from column 311. A third copy of V, V3, may be stored in column 313, distantly located from both columns 311 and 312. Storing each copy of the data in a physically remote location from the other copies may reduce the chance of an error to occur in all three copies of data V since, as already noted, errors are localized in general.

Comparison section 320 may comprise a plurality of cells arranged in rows and columns. Two copies of data item V (e.g. V1 and V2) may be copied from storage section 310 into two different rows, row 321 and row 322, of comparing section 320, such that a bit j of one copy of V (e.g. $V1_j$) and bit j of the second copy (e.g. $V2_j$) may be located on the same column j of comparison section 320 and thus may be connected by the same bit lines.

It may be appreciated that comparison section 320 may compare any two of the three versions of data item V in order to find errors. If errors were found, comparison section 320 may use the third copy to write the correct values back into the other two copies.

Figure 4:
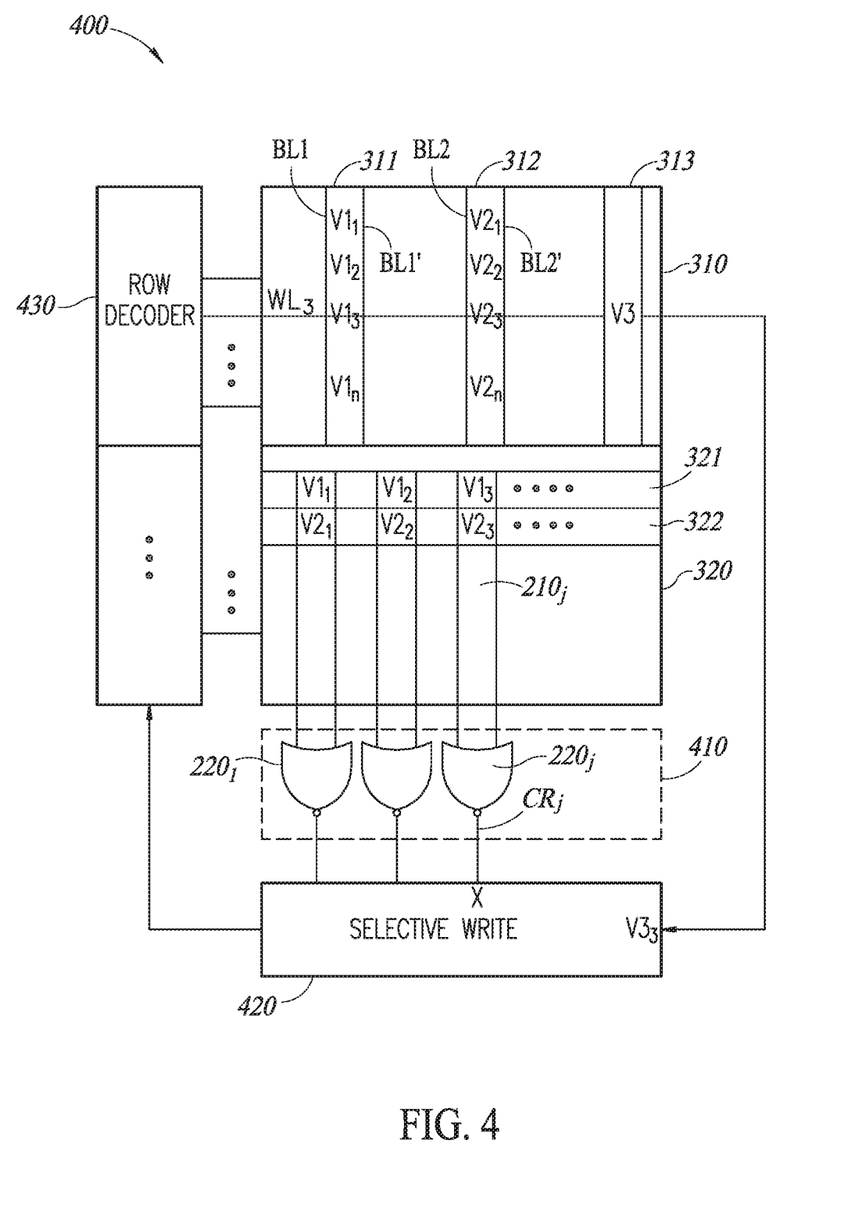
FIG. 4 is a schematic illustration of a self-correcting memory device (SCMD), constructed and operative in accordance with an embodiment of the present invention.

Reference is now made to FIG. 4, which schematically illustrates a self-correcting memory device (SCMD) 400, constructed and operative in accordance with an embodiment of the present invention. SCMD 400 comprises an error correction unit 300, a row 410 of comparing elements, a selective write unit 420 and a row decoder 430.

As detailed herein above, storage section 310 may store three copies V1, V2 and V3 of a data item V, each copy stored in a different column, and comparison section 320 may temporarily store two copies (e.g. V1 and V2) in two different rows.

In one embodiment, row 410 of comparing elements comprises a plurality of NOR gates 220. Each NOR gate $220_j$ may be located below a corresponding column $210j$. Thus, NOR gate $220_j$ may be connected on input to bit line BL and bit line BL' of column $210j$ of comparison section 320. NOR gate $220_j$ may be connected on output to selective write unit 420, effectively creating a plurality of comparing units 200. The output $CR_j$ of NOR gate $220_j$ may provide the comparison result between bit $V1_j$ and bit $V2_j$. As detailed with respect to FIG. 2, the $CR_j$ value of NOR gate $220_j$ may be a 1 only when $V1_j$ and $V2_j$ are not the same. It may be appreciated that all NOR gates $220_j$ may provide their outputs $CR_j$ concurrently, which may provide indications regarding the corruption of each and every bit of V1 and V2, in a single cycle. It may be appreciated that all errors in the relevant copies, V1 and V2, of data item V, may be detected in a single comparison operation, and may be correct regardless of the size of the data and of the number of errors.

Selective write unit 420 may receive the change indication of all comparison results $CR_j$ indicating which bit j (if any) is corrupted. A value 1 for any $CR_j$ may activate selective write unit 420 to write the jth bit of copy V3 stored in storage section 310, back into bits j of V1 and V2.

In order to write the correct value for each corrupted bit, selective write unit 420 may instruct row decoder 430 to activate the word lines connecting the corrupted bits. If, for example, the value of $CR_3$ is 1, bit 3 in either V1 or V2 is corrupted and needs to be fixed. Selective write unit 420 may therefore instruct row decoder 430 to activate word line $WL_3$.

Selective write unit 420 may read the value of bit 3 of copy V3, stored in column 311, and may instruct row decoder 430 to activate the word line $WL_3$ in order to write the value of $V3_3$ into bit 3 of V1 and bit 3 of V2. At the same time, selective write unit 420 may activate the bit lines BL and BL' of columns 311 and 312, where copies V1 and V2 are stored, respectively, to enable writing the correct value from V3. If the correct value is 1, selective write unit 420 may set the value 1 on data bit lines BL1 and BL2 and may set the value 0 on complement bit lines BL1' and BL2'. If the correct value is 0, selective write unit 420 may set the value 0 on data bit lines BL1 and BL2 and may set the value 1 on complement bit lines BL1' and BL2'.

In order to avoid writing any value on other columns of storage section 310, selective write unit 420 may set the value 1 on both data bit line BL and complement bit line BL' of all other columns (i.e. except columns 311 and 312).

Figure 5:
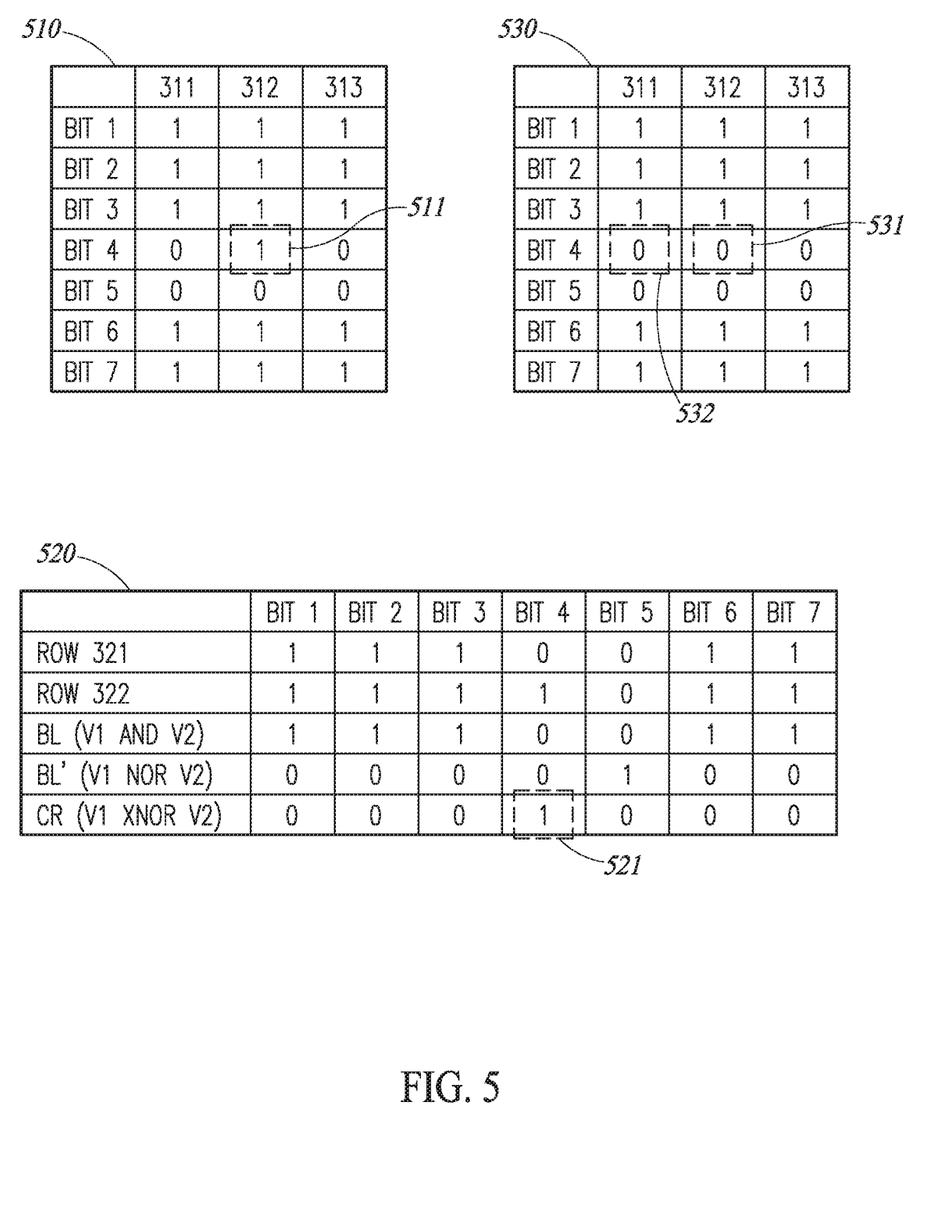
FIG. 5 is an example of how a data item is handled by SCMD device of FIG. 4.

FIG. 5, to which reference is now made, is an example of how a 7 bit data item V, having the value 1110011, may be handled by SCMD 400. Table 510 is an illustration of the values stored in storage section 310. A first copy of data item V is stored in column 311, a second copy is stored in column 312 and a third copy is stored in column 313. It may be appreciated that the value of bit 4 in column 312 (indicated by reference numeral 511) erroneously stores the value 1 instead of the value 0, i.e. has been corrupted.

Table 520 is an illustration of the values stored in comparison section 320. The values from column 311 may be copied to row 321 of comparison section 320 and the values from row 312 may be copied to row 322. Once all the columns (bit 1-bit 7) are activated for a read operation, and rows 321 and 322 are activated by row decoder 430, the value on data bit line BL (shown in the row labeled BL) may be the result of a Boolean AND operation performed between each bit of row 321 and each bit of row 322. Likewise, the value on complement bit line BL' (shown in the row labeled BL') may be the result of a Boolean NOR operation performed between the bits of row 321 and the bits of row 322. The value on CR may be the result of a NOR operation performed between outputs of data bit line BL and complement bit line BL', which is a XNOR operation on the bits of row 321 and the bits of row 322 and indicates if a bit is corrupted. It may be appreciated that, in the example of FIG. 5, the CR value of all bits except the CR value of bit 4 (indicated by reference numeral 521) is 0, indicating that bit 4 is corrupted.

Table 530 is an illustration of the values stored in comparison section 320 after selective write unit 420 activated word line WL of bit 4 in storage section 310 and wrote the value taken from column 313 (the value 0) back to columns 311 and 312, (indicated by reference numerals 531 and 532), thereby correcting the value of the corrupted bit 4.

It may be appreciated that selective write unit 420 may not know which copy is corrupted, the one stored in column 311 or the one stored in column 312, and therefore, may write the correct value to both columns.

If the value of all CRs is 0, indicating that both V1 and V2 copies of data item V are the same, SCMD 400 may compare copies V2 and V3 and may use the V1 copy to make the correction, if necessary.

It may be appreciated that multiple errors, indicated by multiple instances of CR having the value 1, may be corrected by selective write unit 420 in at most two operations. In a first write operation, selective write unit 420 may write the value 1 to all relevant bits and in a second write operation, may write the value 0 to all relevant bits.

It may be appreciated that SCMD 400 may maintain the validity of the data stored in storage section 310 without using error correction codes, and without adding bits to the actual data. In addition, the detection and correction of errors is done jointly, in a single unit of operation, and in very few cycles. Moreover, there is no need to perform additional calculation; the correction may be performed immediately as corruptions are found.

Applicant has realized that error correction capabilities, similar to the capabilities provided by SCMD 400 (FIG. 4), may be provided by a standard SRAM memory array when its row decoder receives an address truncated from the LSB bit. When receiving a truncated address, the row decoder may concurrently activate multiple adjacent rows sharing the same MSB bits, as the ones provided by the truncated address.

Figure 6:
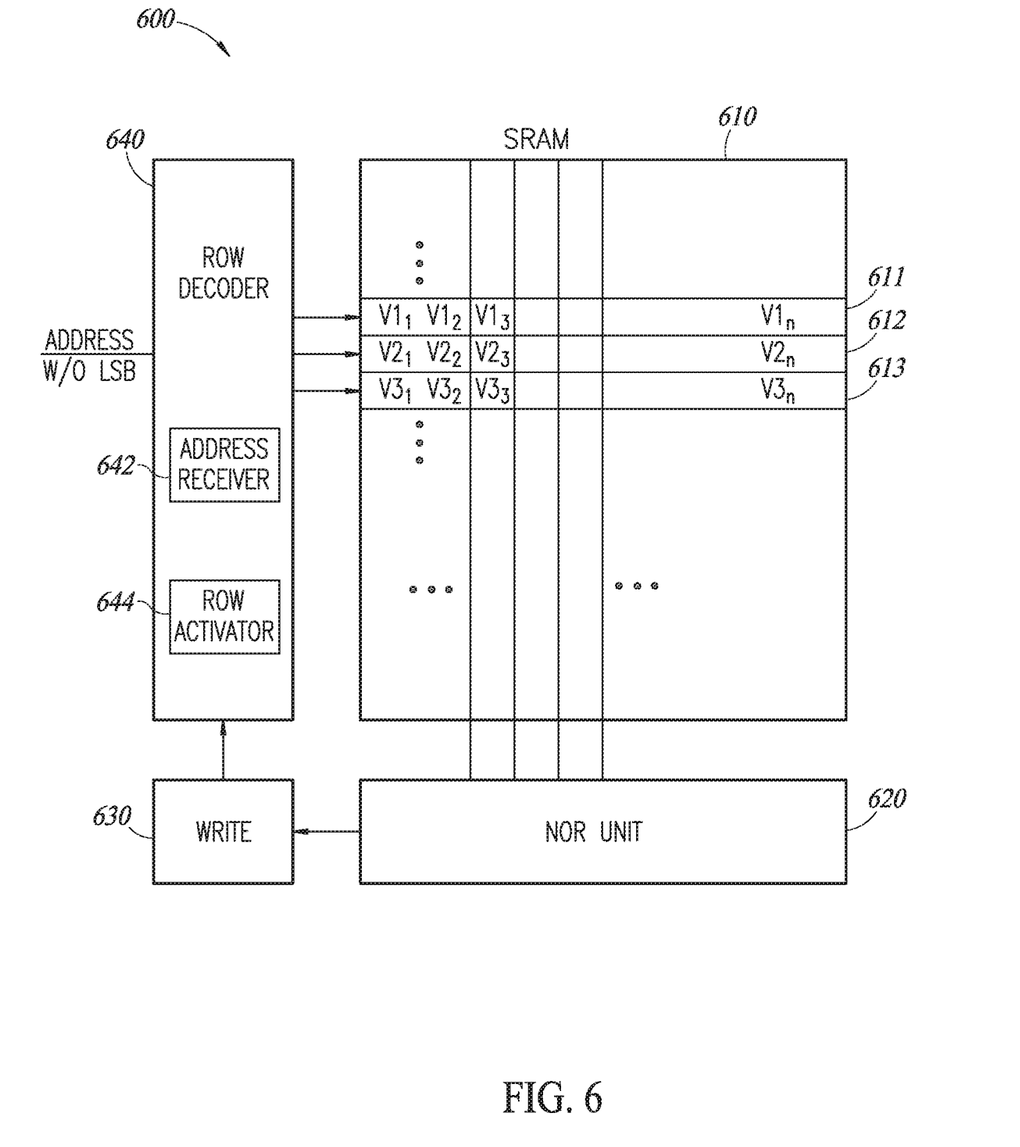
FIG. 6 is a schematic illustration of an SCMD, constructed and operative in accordance with an alternative embodiment of the present invention.

FIG. 6, to which reference is now made, is a self-correcting memory device (SCMD) 600, constructed and operative in accordance with an alternative embodiment of the present invention which may provide error correction capabilities to a standard SRAM memory array. SCMD 600 comprises a standard SRAM memory array 610, a NOR unit 620, a write unit 630 and a row decoder 640.

Standard SRAM memory array 610 may comprise a plurality of SRAM cells arranged in rows and columns. As already discussed with respect to FIG. 3, three copies of each data item V may be needed for the error detection and correction procedure: two copies to compare at any one time, in order to detect errors, and a third copy, assumed to be uncorrupted, to be used as a reliable copy of the original data item V from which the correct bit values may be read and written back into the corrupted copies. In this embodiment, a first copy, e.g. V1, may be stored in row 611, a second copy, e.g. V2, may be stored in row 612, adjacent to row 611, and a third copy, e.g. V3, may be stored in row 613. The addresses of rows 611 and 612 may be similar except for the LSB. Row 613 may be located anywhere in standard SRAM memory array 610, preferably located remotely from rows 611 and 612, to minimize the chances of it being corrupted together with row 611 or row 612.

NOR unit 620, similar to row 410 of comparing elements of SCMD 400 (FIG. 4), may comprise a plurality of NOR gates, each NOR gate connected to a bit line BL and to a complementary bit line BL' connecting cells in columns of standard SRAM memory array 610. It may be appreciated that each NOR gate may provide an indication regarding the result of a comparison between activated cells connected by the same bit lines BL and BL' and may indicate if the bits are corrupted. The value 1 indicates that the values stored in all activated cells are different, while the value 0 indicates that the values stored in all activated cells are identical. The number of NOR gates may be as large as the size of a data item (V) stored in a row of standard SRAM memory array 610. NOR unit 620 may concurrently provide multiple indications of corruption of multiple bits of the stored data item.

Write unit 630, constructed and operative in accordance with an alternative embodiment of the present invention, may receive from NOR unit 620 an indication regarding all corrupted bits and may instruct row decoder 640 as to which row to select for a consequent write operation, for fixing the corrupted bits of V1 and V2 stored in rows 611 and 612 of standard SRAM memory array 610. When receiving an indication regarding a corruption, write unit 630 may create a destination address of the row needs to be corrected. As opposed to the comparison operation, for the write operation, the rows are accessed individually. Row decoder 640, constructed and operative in accordance with an alternative embodiment of the present invention comprises an address receiver 642 and a row activator 644.

Address receiver 642 may receive a destination address and instruct row activator 644 to activate the rows located in the destination address.

In accordance with a preferred embodiment of the present invention, the destination address for the comparison operation may be an address prefix, i.e. a portion of a valid address without its LSB. It may be appreciated that when an address is truncated from one least significant bit, row decoder 640 may concurrently activate two adjacent rows sharing the same MSB bits. For this, address receiver 642 may instruct row activator 644 to activate two rows having an address with the destination address as prefix.

It may be appreciated that SCMD 600 may correct the stored data by first providing a complete destination address of row 611 and then by providing the complete address of row 612. Alternatively, SCMD 600 may correct the stored data by providing the common prefix of both rows 611 and 612 and concurrently activating rows 611 and 612.

As already mentioned hereinabove, NOR unit 620 may provide a comparison result between two activated cells in two different rows. When row decoder 640 concurrently activates rows 611 and 612, NOR unit 620 may provide an indication that a bit in either row 611 or row 612 is corrupted. When at least one bit is corrupted, write unit 630 may instruct row decoder 640 to activate both rows 611 and 612 concurrently, or one after the other.

Write unit 630 may correct any corrupted value stored in rows 611 and 612. In one embodiment, write unit 630 may write the correct values of all bits taken from row 613 (and not just the corrupted ones) back to rows 611 and 612. Alternatively, write unit 630 may write a new value only to bits indicated as corrupted by NOR unit 620.

As mentioned hereinabove, a destination address sent to row decoder 640 may be a complete address of a specific row or an address prefix, i.e. a portion of a valid address without its m least significant bits. Address receiver 642 may instruct row activator 644 to activate all rows having an address starting with the destination address when the destination address is a partial address. It may be appreciated that when an address is truncated from its two least significant bits row decoder 640 may concurrently activate 4 adjacent rows sharing the same prefix and generally the number of rows that row decoder 640 may activate when receiving a prefix of an address, truncated from its m least significant bits is $2^m$ rows.

The various embodiments of the present invention may be useful especially in mission critical applications, where the possible damage caused by an undetected soft error in memory is considerably more damaging than the cost of the extra space required to store the duplicated data. Examples of applications for which the extra space may be a reasonable investment may be for products operating in outer space, medical devices, such as MRI machines or radiation devices, products operating in noisy environments, etc. In these types of applications, an error is more costly than the extra real estate used on the chip.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A self-correcting memory device (SCMD) comprising:
   a non-destructive memory array comprising memory cells arranged in rows and columns;
   a storage section to store a first copy, a second copy and a third copy of a data item in physically separated columns in said memory array;
   a comparison section to temporarily store said first copy in a first row and said second copy in a second row of said memory array;
   a comparing element to compare between bits of said first and second rows and to provide at least one per bit change indication;
   a selective write unit to receive said at least one per bit change indication and to fetch from said third copy a correct value for each bit having a positive bit change indication; and
   a row decoder to concurrently write each said correct value back to its bit location in said first and second copies.

2. A self-correcting memory device (SCMD) comprising:
   an SRAM memory array comprising memory cells arranged in rows and columns to store a first copy of a data item in a first row, a second copy of said data item in a second row and a third copy of said data item in a third row;
   a row decoder to concurrently activate said first row and said second row;
   a NOR unit to compare between bits of said first row and bits of said second row and to provide per bit change indications;
   a write unit to receive said per bit change indications, to fetch a correct value from said third row; and
   said row decoder to concurrently write said correct value back into said first row and said second row.

3. The SCMD of claim 2 wherein an address of said first row and an address of said second row differ in the LSB (least significant bit).

4. The SCMD of claim 3 wherein said row decoder comprising:
   an address receiver to receive one or more destination addresses; and
   a row activator to activate rows located in said one or more destination addresses.

5. The SCMD of claim 4 wherein said address receiver to receive a partial address and said row activator to activate a plurality of rows in addresses having a prefix identical to said partial address.

6. The SCMD of claim 2 wherein said correct value is an entire row and said row decoder to write said entire row into said first row and said second row.

7. The SCMD of claim 2 wherein said correct value comprises bits indicated by a positive change indication and said row decoder to write said bits to locations in said first row and locations in said second row, said locations indicated by said positive change indications.

8. A method for detecting and correcting errors in a non-destructive memory array comprising memory cells arranged in rows and columns, the method comprising:
   storing a first copy, a second copy and a third copy of a data item in physically separated columns in said memory array;

temporarily storing said first copy in a first row and said second copy in a second row of said memory array;

comparing between bits of said first and second rows and providing at least one per bit change indication;

receiving said at least one per bit change indication and fetching from said third copy a correct value for each bit having a positive bit change indication; and writing each said correct value back into a bit, indicated by said positive bit change indication, in said first and second copies.

9. A method for detecting and correcting errors in a non-destructive memory array comprising memory cells arranged in rows and columns, the method comprising:

storing a first copy of a data item in a first row, a second copy of said data item in a second row and a third copy of said data item in a third row;

concurrently activating said first row and said second row;

comparing between bits of said first row and bits of said second row and providing per bit change indications;

fetching a correct value from said third row; and writing said correct value back into said first row and said second row.

10. The method of claim 9 wherein an address of said first row and an address of said second row differ in the LSB.

11. The method of claim 10 wherein said comparing comprising:

receiving one or more destination addresses; and activating rows located in said destination addresses.

12. The method of claim 11 wherein said destination address is a partial address and said activating activates a plurality of rows in addresses having a prefix identical to said partial address.

13. The method of claim 9 wherein said correct value is an entire data item and said writing comprises writing said entire data item into said first row and into said second row.

14. The method of claim 9 wherein said correct value comprises bits indicated by a positive change indication and said writing comprises writing said correct values to locations in said first row and said second row each of said locations indicated by a positive change indication.

* * * * *